United States Patent [19]
Ichikawa et al.

[11] Patent Number: 6,104,086
[45] Date of Patent: Aug. 15, 2000

[54] SEMICONDUCTOR DEVICE HAVING LEAD TERMINALS BENT IN J-SHAPE

[75] Inventors: Seiji Ichikawa; Takeshi Umemoto; Toshiaki Nishibe; Kazunari Sato; Kunihiko Tsubota; Masato Suga; Yoshikazu Nishimura; Keita Okahira; Tatsuya Miya; Toru Kitakoga; Kazuhiro Tahara, all of Tokyo, Japan

[73] Assignee: NEC Corporation, Tokyo, Japan

[21] Appl. No.: 09/059,316

[22] Filed: Apr. 13, 1998

[30] Foreign Application Priority Data

May 20, 1997 [JP] Japan .................................. 9-129671

[51] Int. Cl.⁷ .................................................. H01L 23/48
[52] U.S. Cl. ........................ 257/690; 257/692; 257/696; 257/712; 257/787
[58] Field of Search ..................................... 257/666, 696, 257/690, 692, 787, 712, 713

[56] References Cited

U.S. PATENT DOCUMENTS 3,930,114  12/1975  Hodge ........................................ 174/52
4,698,660  10/1987  Kubota et al. ............................ 357/74

FOREIGN PATENT DOCUMENTS

| 6-061408 | 3/1994 | Japan | H01L 23/50 |
| 07221242 | 8/1995 | Japan | H01L 23/50 |
| 07263607 | 10/1995 | Japan | H01L 23/50 |
| 8-083870 | 3/1996 | Japan | H01L 23/28 |
| 08088296 | 4/1996 | Japan | H01L 23/12 |
| 2154791 | 9/1985 | United Kingdom | H01L 23/36 |

*Primary Examiner*—Carl Whitehead, Jr.
*Assistant Examiner*—Roy Potter
*Attorney, Agent, or Firm*—Hayes Soloway Hennessey Grossman & Hage PC

[57] ABSTRACT

A semiconductor device having lead terminals bent in a J-shape is disclosed. A radiating plate having a recess formed on an outer peripheral portion thereof is exposed to a lower face of a resin member and free ends of outer portions of the lead terminals are positioned in the recess of the radiating plate. The free ends of the outer portions of the lead terminals and the recess of the radiating plate are isolated from each other by projections of the resin member. Since the radiating plate is exposed to the lower face of the resin member, the heat radiating property is high whereas the radiating plate and the lead terminals are not short-circuited to each other at all.

6 Claims, 7 Drawing Sheets

SEMICONDUCTOR DEVICE HAVING LEAD TERMINALS BENT IN J-SHAPE

BACKGROUND OF THE INVENTION

1. Field of the Invention:

This invention relates to a semiconductor device, and more particularly to a semiconductor device having lead terminals bent in a J-shape and a method of manufacturing the semiconductor device.

2. Description of the Related Art

Conventionally, semiconductor devices such as an LSI (Large Scale Integrated Circuit) and a transistor are utilized in various electronic apparatus.

In such a semiconductor device as just mentioned, a pellet of a semiconductor circuit is encapsulated in a resin member, and a large number of lead terminals each formed from an elongated conductive plate are provided on the opposite sides of the resin member. Since the lead terminals are connected to connection pads of the pellet in the inside of the resin member, if the semiconductor device is mounted on a circuit board and the lead terminals are connected to signal lines, then various signals can be inputted to and outputted from the pellet.

While such semiconductor devices are utilized to various applications, for example, for a semiconductor device for use with a portable telephone set, it is required to minimize the mounting area. Thus, a semiconductor device wherein outer portions of lead terminals extending outwardly from side faces of a resin member are bent in a J-shape and the free ends of the lead terminals are positioned on a lower face of the resin member to reduce the mounting area has been put into practical use.

Such semiconductor devices are disclosed, for example, in Japanese Patent Laid-open No. 221242/95, Japanese Patent Laid-open No. 263607/95, and Japanese Patent Laid-open NO. 88296/96.

In a semiconductor device wherein lead terminals are bent in a J-shape and the free ends thereof are positioned on a lower face of a resin member as described above, since also the overall occupation area is decreased and the lead terminals are connected to a circuit board at positions of the lower face of the resin member, the mounting area can be reduced.

However, with such a semiconductor device as described above, since the free ends of the lead terminals are positioned on the lower face of the resin member, if a radiating plate made of a conductive island is exposed to the lower face of the resin member, then the radiating plate and the lead terminals are short-circuited to each other.

Therefore, a semiconductor device wherein the lead terminals are bent in a J-shape as described above is so structured that the radiating plate is not exposed to the lower face of the resin member, and consequently, it does not exhibit a good heat radiating property of the pellet. However, in a semiconductor device utilized for transmission of radio waves in a portable telephone set, the pellet generates a large amount of heat because it consumes a large amount of power, and therefore, it is required to radiate the heat efficiently.

In this connection, in the semiconductor device disclosed in Japanese Patent Laid-open No. 221242/95, the radiating plate is exposed to the lower face of the resin member while an insulating film is applied to the lower face of the radiating plate to prevent short-circuiting with the lead terminals. However, since this structure does not allow connection of the radiating plate to a grounding line of the circuit board, a good heat radiating property cannot be anticipated.

SUMMARY OF THE INVENTION

It is an object of the present invention to provide a semiconductor device having lead terminals bent in a J-shape with the free ends of the lead terminals positioned on a lower face of a resin member wherein a radiating plate is exposed to the lower face of the resin member to realize a good heat radiating property whereas the radiating plate and lead terminals are not short-circuited to each other.

In a conventional semiconductor device to which the present invention is applied, a pellet of a semiconductor circuit having a plurality of connection pads provided thereon is placed on an upper face of a radiating plate, and a plurality of lead terminals each formed from an elongated conductive plate are disposed on the outer sides of the pellet. The lead terminals and connection pads of the pellet are connected individually to each other by bonding wires, and at least a portion of the radiating plate, the pellet, the bonding wires and inner portions of the lead terminals are encapsulated in a resin member. The outer portions of the lead terminals which extend outwardly from side faces of the resin member are bent in a J-shape such that free ends of the outer portions of the lead terminals bent in this manner are positioned on the lower face of the resin member.

According to a first aspect of the present invention applied to such a semiconductor device as described above, a recess are formed on an outer peripheral portion of the radiating plate, and the radiating plate is exposed to the lower face of the resin member. The free ends of the outer portions of the lead terminals are positioned in the recess of the resin member, and insulating elements are positioned in gaps between the free ends of the outer portions of the resin member and the recess of the radiating plate.

Accordingly, since the outer portions of the lead terminals which extend outwardly from the side faces of the resin member are bent in a J-shape and the free ends are positioned on the lower face of the resin member, the mounting area is reduced. Besides, since the radiating plate is exposed to the lower face of the resin member, the heat radiating property of the pellet is high.

Meanwhile, since the free ends of the outer portions of the lead terminals are positioned in the recess formed on the outer peripheral portion of the radiating plate and the insulating elements are positioned in the gaps between the free ends of the lead terminals and the recess of the radiating plate, the lead terminals are not short-circuited to the radiating plate. In short, the present invention can achieve both of reduction of the mounting area and augmentation of the heat radiating property of a semiconductor device.

It is to be noted that, in the present invention, the direction in which the pellet is mounted with respect to the radiating plate is referred to as upward direction while a direction perpendicular to the direction is referred to as sideward direction. However, such directions are used conveniently in order to simplify description and do not restrict any direction when the device is manufactured or used actually.

Further, the radiating plate in the present invention signifies a member on which a pellet is mounted and which contributes to radiation of heat from the pellet, and allows an island made of a metal. The recess of the radiating plate signify shapes from which material at the portions of the radiating plate at which the free ends of the lead terminals are positioned is removed, and they need not necessarily have recessed or concave outer shapes. The insulating elements may be any member or members which have an insulating property and can be disposed in the gaps between the lead terminals and the radiating plate, and thus allow, for example, a bonding agent or projections of the resin member.

Meanwhile, in a semiconductor device according to a second aspect of the present invention, a recess are formed on an outer peripheral portion of the radiating plate, and the radiating plate is exposed to the lower face of the resin member. Projections provided projectingly on an outer peripheral portion of the lower face of the resin member are positioned in the recess of the radiating plate, and recess are formed on the lower faces of the projections of the resin member. Further, the free ends of the outer portions of the lead terminals are positioned in the recess of the resin member.

Accordingly, in the semiconductor device of the present invention, since the outer portions of the lead terminals which extend outwardly from the side faces of the resin member are bent in a J-shape and the free ends of them are positioned on the lower face of the resin member, the mounting area is reduced. Besides, since the radiating plate is exposed to the lower face of the resin member, the heat radiating property of the pellet is high.

Meanwhile, since the free ends of the outer portions of the lead terminals are positioned in the recess formed on the outer peripheral portion of the radiating plate and the projections of the resin member are positioned in the gaps between the free ends of the lead terminals and the recess of the radiating plate, the lead terminals are not short-circuited to the radiating plate. In short, the present invention can achieve both of reduction of the mounting area and augmentation of the heat radiating property of a semiconductor device.

In the semiconductor devices of the present invention, the free end of the outer portion of one of the lead terminals may be positioned in one of the recesses of the radiating plate.

In this instance, the plurality of projections positioned in the gaps of the plurality of recesses of the resin plate are positioned in the gaps of the plurality of lead terminals. In short, since the radiating plate can be formed with a larger area, the heat radiating property of the semiconductor device can be further augmented.

In the semiconductor devices of the present invention, the free ends of the outer portions of a plurality of lead terminals may be positioned in one of the recesses of the radiating plate.

In this instance, since the number of the recess of the radiating plate is smaller than the number of lead terminals, the radiating plate can be formed with a simpler profile. Consequently, the productivity of the semiconductor device can be improved.

In a conventional method of manufacturing a semiconductor device to which the present invention is applied, a single lead frame wherein a plurality of lead terminals and a single radiating plate are connected integrally to each other by tie bars or like elements is formed. A pellet of a semiconductor circuit having a plurality of connection pads provided on a surface thereof is placed onto an upper face of a portion of the lead frame corresponding to the radiating plate, and the plurality of connection pads of the pellet and the plurality of lead terminals of the lead frame are connected individually to each other by bonding wires. The lead frame, on which the pellet and the bonding wires are mounted integrally, is positioned into a cavity of at least one pair of mutually removable metal molds, and the metal molds are closed to each other so that they hold outer portions of the lead terminals therebetween. A molten resin is filled into the cavity of the metal molds. The filled resin is left so as to be solidified to form a resin member wherein at least a portion of the radiating plate, the pellet, the bonding wires and inner portions of the lead terminals are encapsulated while outer portions of the lead terminals are exposed outside. The tie bars or the like elements of the lead frame are cut away to separate the radiating plate and the plurality of lead terminals individually from one another, and the outer portions of the lead terminals which extend outwardly from side faces of the resin member are bent into a J-shape until free ends thereof are positioned on the lower face of the resin member.

According to a further aspect of the present invention applied to such a method of manufacturing a semiconductor device as described above, when a lead frame is formed, a recess are formed on the outer peripheral portion of the radiating plate. When the lead frame is placed into the metal molds, the lower face of the radiating plate come into contact with an inner face of the metal molds. When the resin member is formed, projections having recess formed on lower faces thereof are formed in the recess of the radiating plate. When the the outer portions of the lead terminals are bent, the free ends thereof are positioned in the recess of the resin member.

Accordingly, in a semiconductor device manufactured by the method of the present invention, since the outer portions of the lead terminals which extend outwardly from the side faces of the resin member are bent in a J-shape and the free ends of them are positioned on the lower face of the resin member, the mounting area is reduced. Besides, since the radiating plate is exposed to the lower face of the resin member, the heat radiating property of the pellet is high.

Meanwhile, since the free ends of the outer portions of the lead terminals are positioned in the recess formed on the outer peripheral portion of the radiating plate and the projections of the resin member are positioned in the gaps between the free ends of the lead terminals and the recess of the radiating plate, the lead terminals are not short-circuited to the radiating plate.

In short, where the method of manufacturing a semiconductor device of the present invention is applied, a semiconductor device which is small in mounting area and high in heat radiating property and does not suffer from short-circuiting between the radiating plate and the lead terminals can be manufactured simply.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 2:
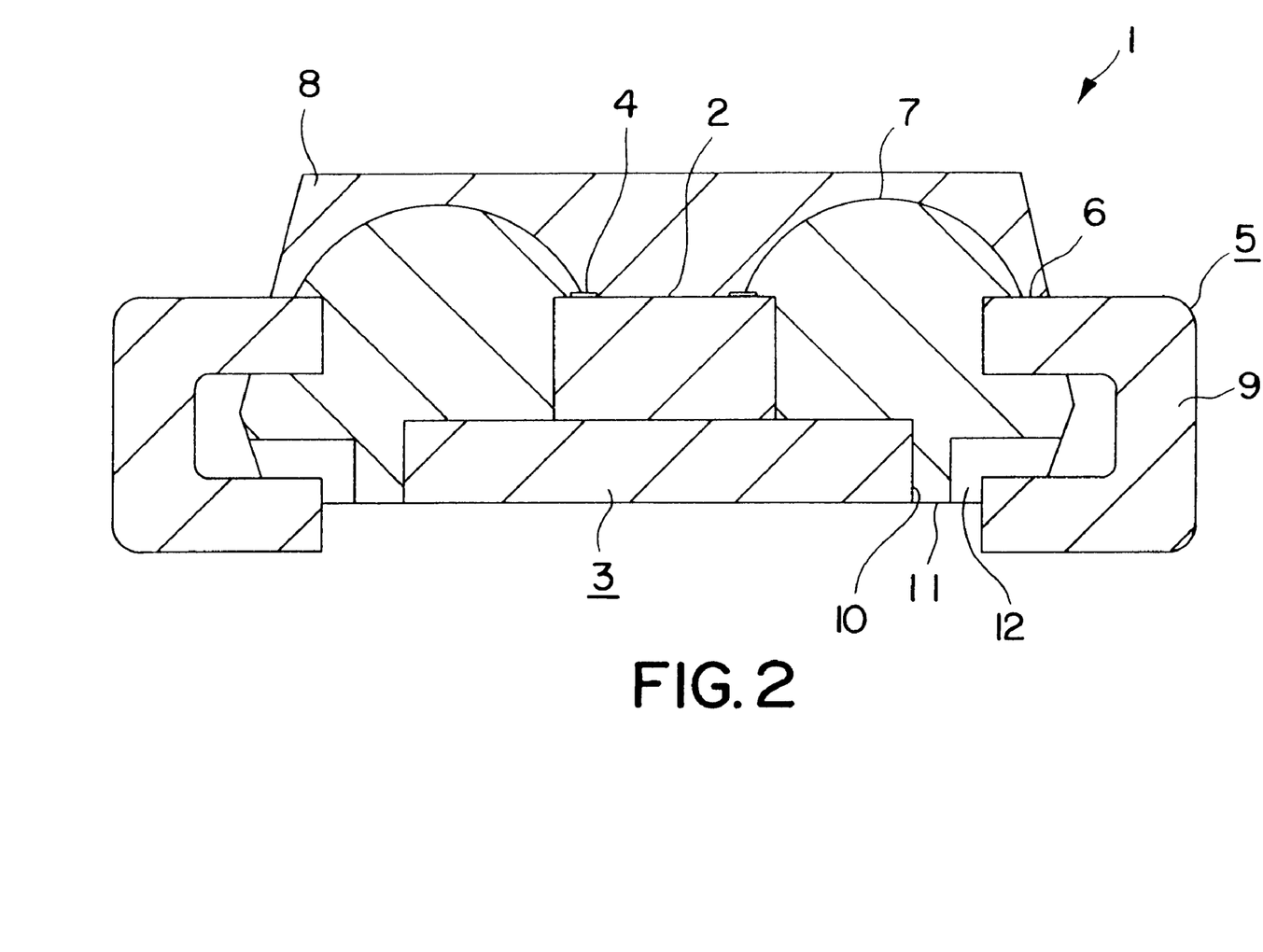
FIG. 2 is a sectional view of the semiconductor device taken along line A—A of FIG. 1b.

Integrated circuit device 1 of an embodiment according to the present invention includes, as shown in FIG. 2, pellet 2 of an integrated circuit formed from a semiconductor circuit. This pellet 2 is mounted on an upper face of radiating plate 3 in the form of an island made of a metal.

A large number of connection pads 4 are formed on an upper face of pellet 2. A large number of lead terminals 5 are arranged on the opposite sides of radiating plate 3. The large number of connection pads 4 of pellet 2 and inner portions 6 of the large number of lead terminals 5 are individually connected to each other by a large number of bonding wires 7.

Pellet 2, part of radiating plate 3, bonding wires 7 and inner portions 6 of lead terminals 5 are encapsulated in resin package 8 which is a resin member. Outer portions 9 of lead terminals 5 extending outwardly from the side faces of resin package 8 are bent in a J-shape.

Figures 1A, 1B:
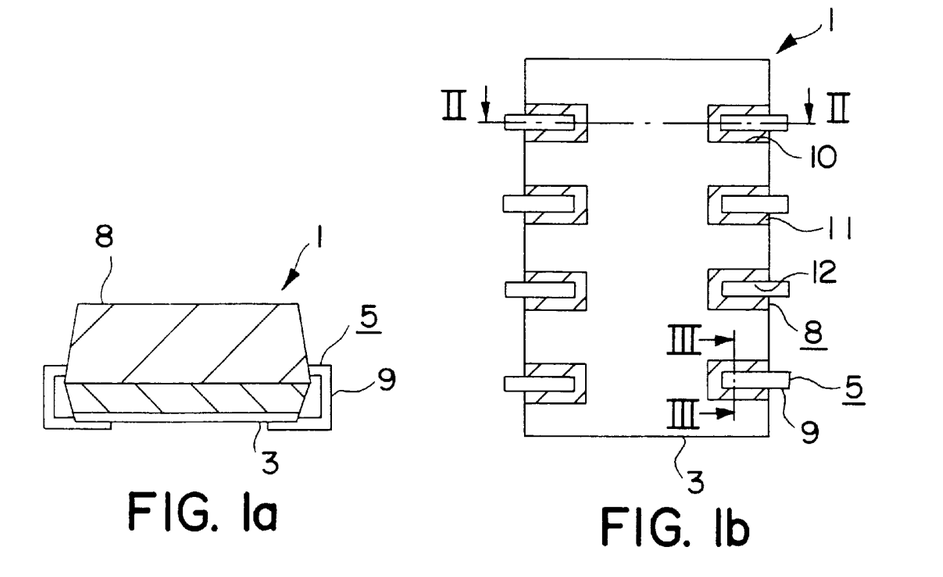
FIG. 1a is a plan view showing an appearance of a semiconductor device of an embodiment of the present invention.
FIG. 1b is a bottom plan view of the semiconductor device.
Figure 1C:
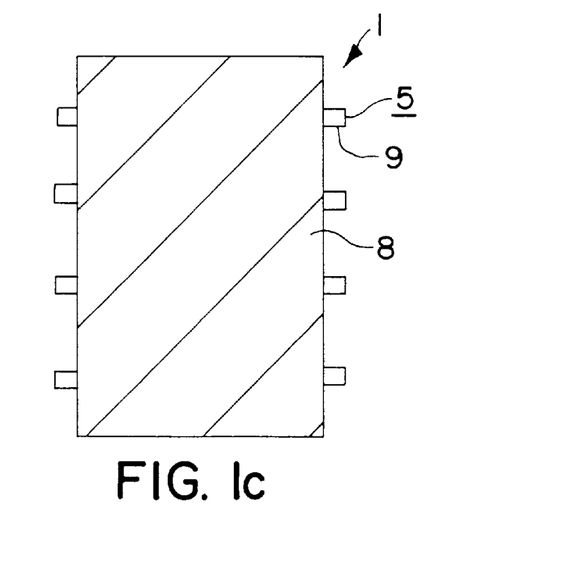
FIG. 1c is a top plan view of the semiconductor device.
Figure 1D:
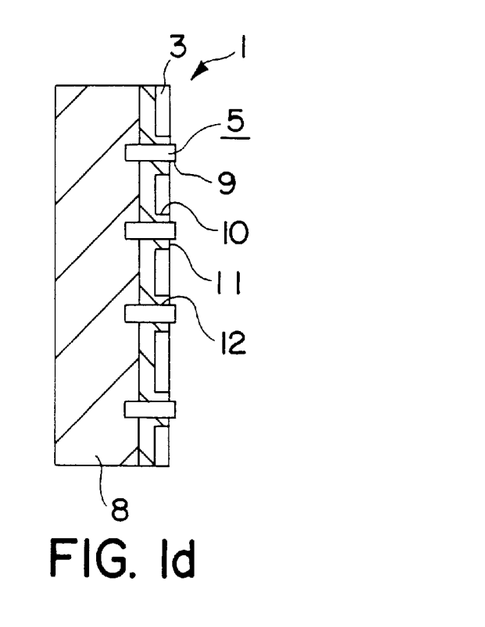
FIG. 1d is a side elevational view of the semiconductor device.

The free ends of thus bent outer portions 9 of lead terminals 5 are positioned on a lower face of resin package 8. It is to be noted, however, that, in integrated circuit device 1 of the present embodiment, radiating plate 3 is exposed to the lower face of resin package 8 as seen in FIGS. 1a to 1c.

A large number of recesses 10 are formed on an outer peripheral portion of radiating plate 3. A large number of projections 11 are provided projectingly on an outer peripheral portion of the lower face of resin package 8. Those projections 11 are individually positioned in recesses 10 of radiating plate 3.

Figure 3:
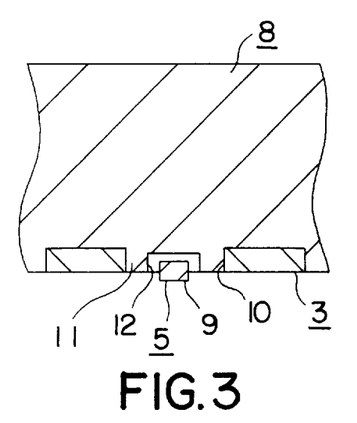
FIG. 3 is a sectional view of the semiconductor device taken along line B—B of FIG. 1b.
Figure 4:
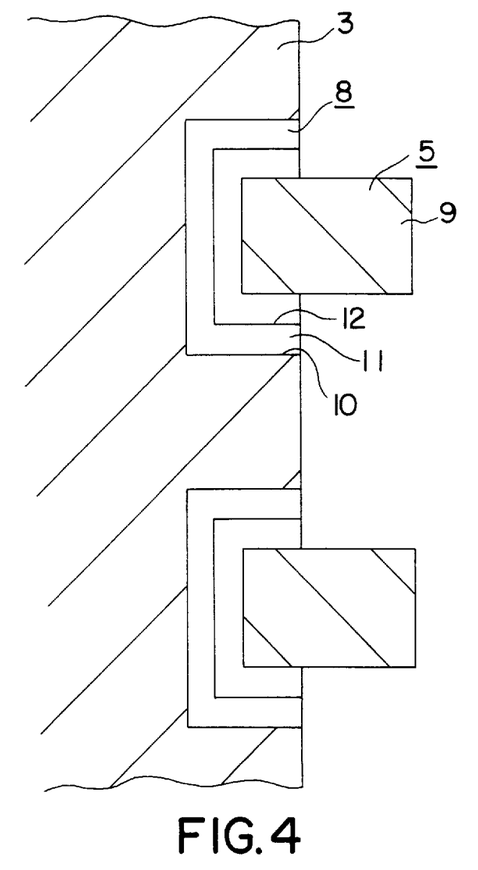
FIG. 4 is a bottom plan view showing essential part of the semiconductor device in an enlarged scale.

Further, recesses 12 each opened on the lower side and the outer side are formed on the bottom faces of large number of projections 11 of resin package 8. As shown in FIGS. 3 and 4, the free ends of the large number of outer portions 9 of lead terminals 5 are individually positioned in recesses 12.

In short, the free ends of outer portions 9 of lead terminals 5 are positioned in recesses 10 of radiating plate 3. Projections 11 of resin package 8 are positioned in gaps between the free ends of outer portions 9 of lead terminals 5 and recesses 10 of radiating plate 3 and serve as insulating members.

It is to be noted that, in integrated circuit device 1 of the present embodiment, each of projections 11 of resin package 8 is positioned in one of recesses 10 of radiating plate 3, and each of recesses 12 is formed on the lower face of one of projections 11 while the free end of outer portion 9 of each of lead terminals 5 is positioned in one of recesses 12.

Figure 6A:
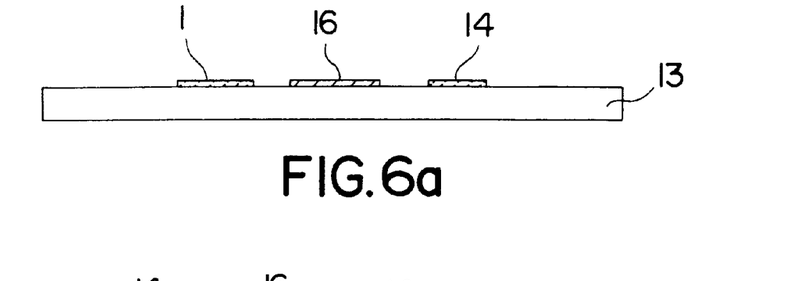
FIG. 6a is a front elevational view showing a circuit board in a mounting step of the semiconductor device.
Figure 6B:
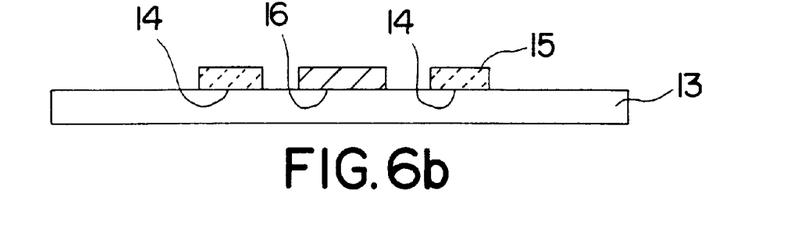
FIG. 6b is a front elevational view showing a condition wherein solder in the form of cream is printed on an upper face of the circuit board.
Figure 6C:
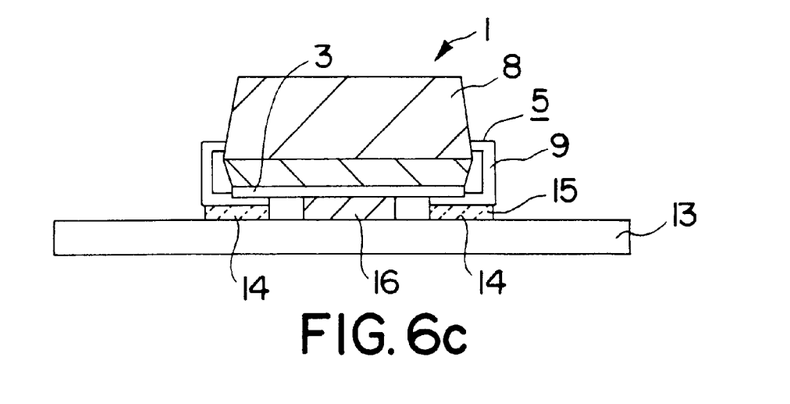
FIG. 6c is a front elevational view showing a condition wherein the semiconductor device is placed on the upper face of the circuit board.
Figure 6D:
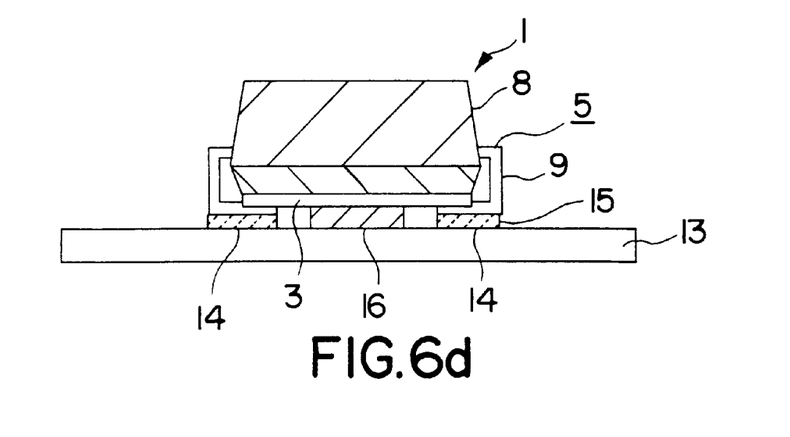
FIG. 6d is a front elevational view showing a condition wherein the solder is solidified to complete the mounting of the semiconductor device.
Figure 7A:
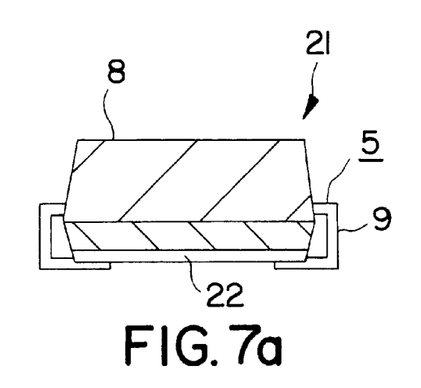
FIG. 7a is a front elevational view showing an appearance of a first modification to the semiconductor device.
Figure 7B:
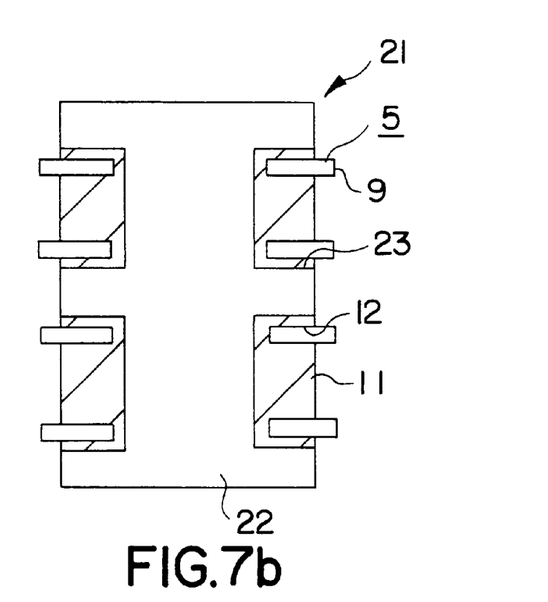
FIG. 7b is a bottom plan view of the first modification.
Figure 7C:
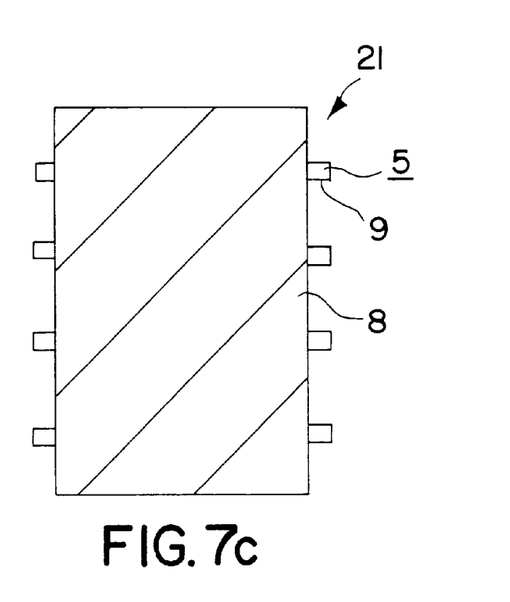
FIG. 7c is a top plan view of the first modification.
Figure 7D:
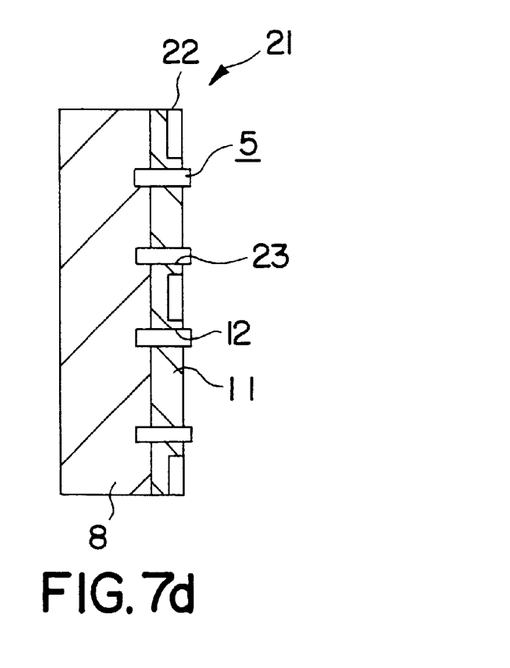
FIG. 7d is a side elevational view of the first modification.
Figure 8A:
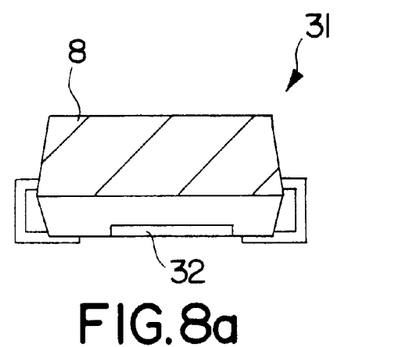
FIG. 8a is a front elevational view showing an appearance of a second modification to the semiconductor device.
Figure 8B:
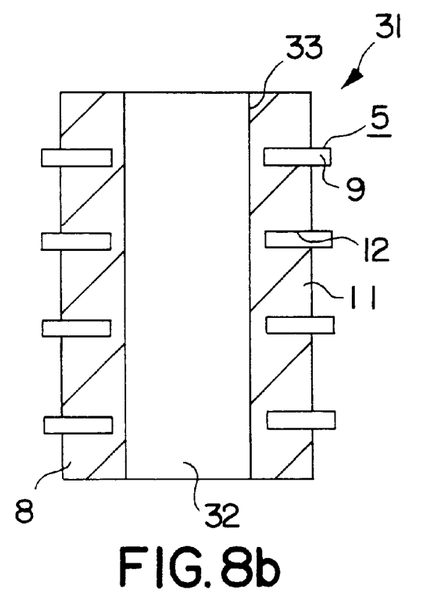
FIG. 8b is a bottom plan view of the second modification.
Figure 8C:
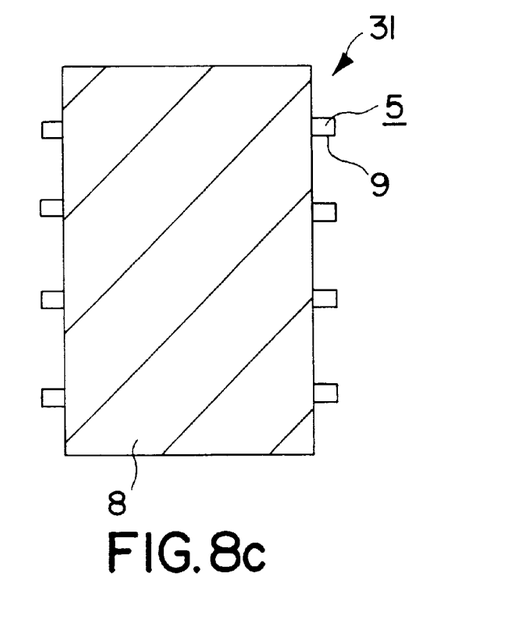
FIG. 8c is a top plan view of the second modification.
Figure 8D:
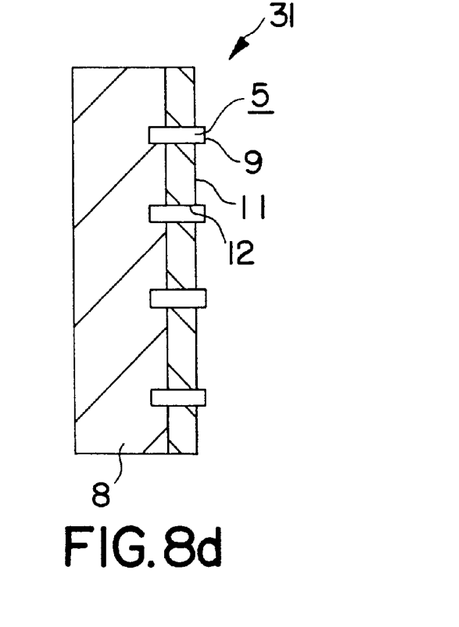
FIG. 8d is a side elevational view of the second modification.

Integrated circuit device 1 of the present embodiment having the construction described above is mounted on an upper face of circuit board 13 as shown in FIG. 6d.

In this instance, the free ends of the large number of lead terminals 5 positioned on the lower face of resin package 8 are individually connected to a large number of signal lines 14 of circuit board 13 by solder 15, and radiating plate 3 exposed to the lower face of resin package 8 is connected to a conductor pattern such as grounding line 16 of circuit board 13 by solder 15.

Integrated circuit device 1 mounted on circuit board 13 in this manner has a reduced mounting area since the outer portions of lead terminals 5 extending outwardly from the side faces of resin package 8 are bent in a J-shape such that the free ends thereof are positioned on the lower face of resin package 8.

Further, since radiating plate 3 on which pellet 2 is mounted is exposed to the lower face of resin package 8 and is connected directly to grounding line 16, it can radiate heat of pellet 2 efficiently.

Meanwhile, in integrated circuit device 1 of the present embodiment, the free ends of lead terminals 5 are positioned in recesses 10 formed on the outer peripheral portion of radiating plate 3. Since projections 11 of resin package 8 are positioned in the gaps between the free ends of lead terminals 5 and radiating plate 3 and serve as insulating members, lead terminals 5 and radiating plate 3 are not short-circuited to each other.

Besides, since the large number of lead terminals 5 and recesses 10 of radiating plate 3 correspond in a one-by-one corresponding relationship to each other, radiating plate 3 is formed with a large area and realizes a good heat radiating property.

Here, a method of manufacturing integrated circuit device 1 of the present embodiment is described briefly.

First, a lead frame wherein a large number of lead terminals 5 and a single radiating plate 3 are integrally connected to each other by tie bars and so forth is formed by etching a very thin metal plate. Naturally, radiating plate 3 is formed in such a shape that the large number of recesses 10 are positioned on an outer peripheral portion thereof.

Then, the lead frame is deformed by a press machine so that inner portions 6 of lead terminals 5 may be positioned higher than radiating plate 3, and pellet 2 is mounted onto the upper face of radiating plate 3 by solder. The large number of connection pads 4 of pellet 2 and the large number of lead terminals 5 are individually connected to each other by bonding wires 7.

The lead frame on which pellet 2 and bonding wires 7 are mounted integrally in this manner is placed into a cavity of a pair of mutually removable metal molds.

Thereupon, outer portions 9 of lead terminals 5 are held by and between the pair of metal molds and the lower face of radiating plate come into contact with the inner face of the metal molds so that those portions may be exposed from resin package 8.

It is to be noted here that the metal molds used for molding a of resin package 8 are formed in such a shape that projections 11 having recesses 12 formed on the lower faces thereof may be molded in recesses 10 of radiating plate 3.

In such a condition as described above, a molten resin is filled into the cavity of the metal molds and is left until it is solidified, thereby forming resin package 8 in which pellet 2, radiating plate 3, bonding wires 7 and inner portions 6 of lead terminals 5 are encapsulated.

Figure 5A:
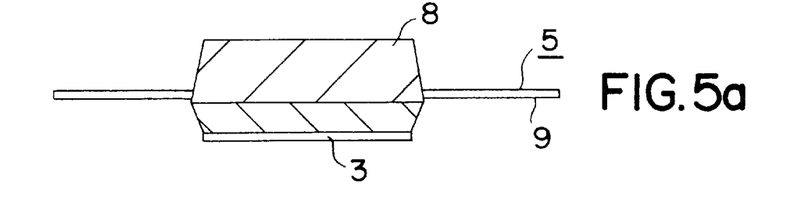
FIG. 5a is a plan view showing a condition wherein lead terminals and a radiating plate are cut away from a lead frame in a process of production of the semiconductor device.
Figure 5B:
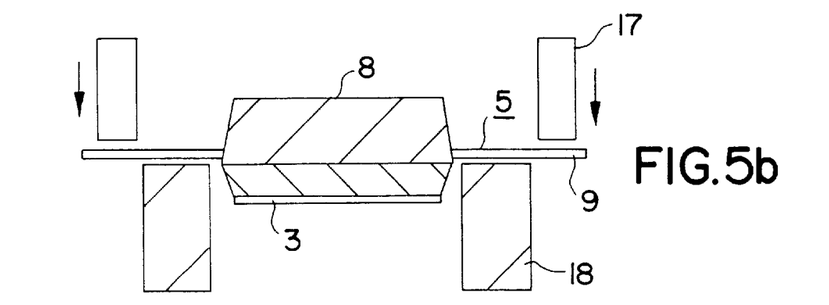
FIG. 5b is a front elevational view illustrating a step of bending outer portions of the lead terminals at positions adjacent the free ends thereof.
Figure 5C:
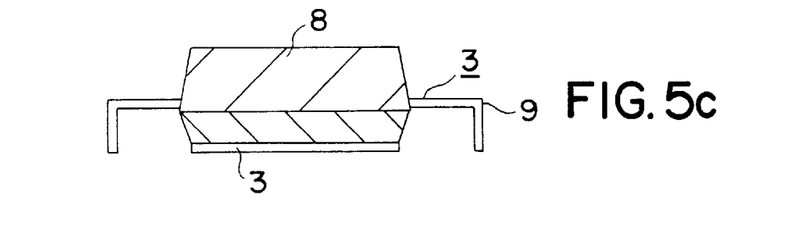
FIG. 5c is a front elevational view showing a condition wherein the outer portions of the lead terminals are bent at the positions adjacent the free ends thereof.
Figure 5D:
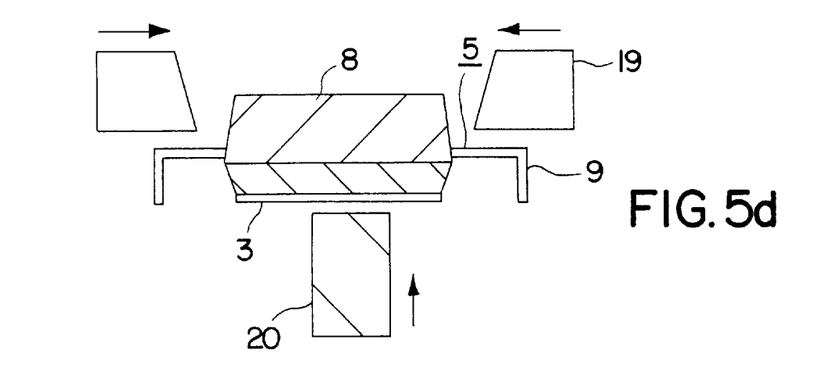
FIG. 5d is a front elevational view illustrating a step of bending the outer portions of the lead terminals at positions adjacent the base ends thereof.
Figure 5E:
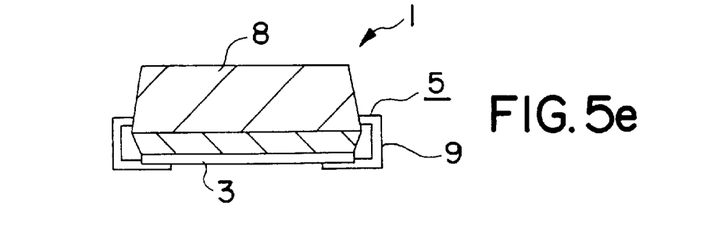
FIG. 5e is a front elevational view showing a condition wherein the outer portions of the lead terminals are bent at the positions adjacent the base ends thereof.

Then, burrs of the resin are removed and the tie bars and so forth of the lead frame are cut away. Consequently, an intermediate wherein outer portions 9 of lead terminals 5 extend outwardly from the side faces of resin package 8 and radiating plate 3 is exposed to the lower face of resin package 8 as shown in FIG. 5a is formed.

Thus, outer portions 9 of lead terminals 5 are bent at positions adjacent the free ends thereof by press metal dies 17 and 18, and outer portions 9 of lead terminals 5 are bent at positions adjacent the base ends thereof by press metal dies 19 and 20 as seen in FIGS. 5b to 5e.

Consequently, lead terminals 5 are bent in a J-shape until the free ends thereof are moved to the lower face of resin package 8 and positioned in recesses 10 of radiating plate 3 with projections 11 of resin package 8 interposed therebetween.

By manufacturing integrated circuit device 1 in such a manner as described above, the structure wherein radiating plate 3 having the large number of recesses 10 formed on the outer peripheral portion thereof is exposed to the lower face of resin package 8 and lead terminals 5 extending outwardly from the side faces of resin package 8 are bent in a J-shape such that the free ends of lead terminals 5 are positioned in recesses 10 of radiating plate 3 with projections 11 of resin package 8 interposed therebetween can be realized simply.

Further, a method of mounting integrated circuit device 1 manufactured in such a manner as described above onto circuit board 13 is described briefly with reference to FIGS. 6a to 6d.

First, signal lines 14 and grounding line 16 are formed at positions of the upper face of circuit board 13 which correspond to radiating plate 3 and lead terminals 5 of integrated circuit device 1 as shown in FIG. 6a.

Then, solder 15 in the form of cream is applied to the surfaces of signal lines 14 and grounding line 16 and then integrated circuit device 1 is mounted onto the surface of signal lines 14 and grounding line 16 as seen in FIGS. 6b and 6c, and then solder 15 is heated so as to be melted and then cooled so as to be solidified as seen in FIG. 6d.

By thus solidified solder 15, lead terminals 5 of integrated circuit device 1 are connected to signal lines 14 of circuit board 13 and radiating plate 3 is connected to grounding line 16. Accordingly, various signals can be inputted to and outputted from pellet 2, and pellet 2 can radiate heat efficiently.

It is to be noted that, in the embodiment described above, lead terminals 5 and recesses 10 of radiating plate 3 correspond in a one-by-one corresponding relationship to each other. However, for example, as in the case of semiconductor device 21 shown in FIGS. 7a to 7d, a plurality of lead terminals 5 may be positioned in each of recesses 23 of radiating plate 22.

In this instance, the area of radiating plate 22 is reduced and the heat radiating property is reduced a little. However, since the shape of radiating plate 22 is simplified, the productivity is augmented.

Furthermore, as in the case of semiconductor device 31 shown in FIGS. 8a to 8d, radiating plate 32 may be formed in a simple rectangular shape with lead terminals 5 positioned on the opposite sides thereof such that the opposite portions of radiating plate 32 may serve as recesses 33.

In this instance, the area of radiating plate 32 is further reduced. However, the shape of radiating plate 32 is much simplified.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:

a resin member having at least one recess formed on an outer peripheral portion of a lower face thereof;

a pellet comprising a semiconductor circuit having a plurality of connection pads provided thereon and encapsulated in said resin member;

a radiating plate having at least one recess formed on an outer peripheral portion thereof and having said pellet mounted on an upper face thereof and encapsulated in said resin member in such a condition as to be exposed to the lower face of said resin member;

a plurality of lead terminals having inner portions encapsulated in said resin member and positioned on the outer sides of said pellet and outer portions extending outwardly from side faces of said resin member and bent in a J-shape such that free ends of said outer portions bent in a J-shape are positioned in said recess of the lower face of said resin member;

a plurality of bonding wires encapsulated in said resin member for connecting said plurality of lead terminals and a plurality of connection pads of said pellet individually to each other; and insulating element positioned in gaps between the free ends of said outer portions of said lead terminals and recess of said radiating plate.

2. A semiconductor device, comprising:

a pellet comprising a semiconductor circuit having a plurality of connection pads provided thereon;

a radiating plate having at least one recess formed on an outer peripheral portion thereof and having said pellet mounted on an upper face thereof;

a resin member having said pellet encapsulated therein and having said radiating plate encapsulated therein in such a manner as to be exposed to a lower face thereof, said resin member having at least one projection formed on an outer peripheral portion of the lower face thereof, said projection being positioned in said recess of said radiating plate, said resin member having at least one recess formed on lower faces of said projections thereof;

a plurality of lead terminals having inner portions encapsulated in said resin member and positioned on the outer sides of said pellet and outer portions extending outwardly from side faces of said resin member and bent in a J-shape such that free ends of said outer portions bent in a J-shape are positioned in said recess of the lower faces of said projections of said resin member; and a plurality of bonding wires encapsulated in said resin member for connecting said plurality of lead terminals and said plurality of connection pads of said pellet individually to each other.

3. A semiconductor device as claimed in claim 1, wherein the free end of the outer portion of each of said lead terminals is positioned in the recess of said radiating plate.

4. A semiconductor device as claimed in claim 2, wherein the free end of the outer portion of each of said lead terminals is positioned in the recess of said radiating plate.

5. A semiconductor device as claimed in claim 1, wherein the free ends of the outer portions of said plurality of lead terminals are positioned in the recess of said radiating plate.

6. A semiconductor device as claimed in claim 2, wherein the free ends of the outer portions of said plurality of lead terminals are positioned in the recess of said radiating plate.

* * * * *